(12) United States Patent
Zi et al.

(10) Patent No.: US 10,274,847 B2
(45) Date of Patent: Apr. 30, 2019

(54) HUMIDITY CONTROL IN EUV LITHOGRAPHY

(71) Applicant: Taiwan Semiconductor Manufacturing Co., Ltd., Hsinchu (TW)

(72) Inventors: An-Ren Zi, Hsinchu (TW); Chin-Hsiang Lin, Hsinchu (TW); Ching-Yu Chang, Yilang County (TW); Joy Cheng, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/708,800

(22) Filed: Sep. 19, 2017

(65) Prior Publication Data

US 2019/0086818 A1    Mar. 21, 2019

(51) Int. Cl.
| | |
|---|---|
| G03F 7/20 | (2006.01) |
| G03F 7/16 | (2006.01) |
| H01L 21/027 | (2006.01) |
| G03F 7/32 | (2006.01) |
| G03F 7/039 | (2006.01) |
| G03F 7/038 | (2006.01) |
| G03F 7/38 | (2006.01) |
| G03F 7/40 | (2006.01) |

(Continued)

(52) U.S. Cl.
CPC .......... *G03F 7/70866* (2013.01); *G03F 7/038* (2013.01); *G03F 7/039* (2013.01); *G03F 7/063* (2013.01); *G03F 7/168* (2013.01); *G03F 7/2004* (2013.01); *G03F 7/3057* (2013.01); *G03F 7/32* (2013.01); *G03F 7/38* (2013.01); *G03F 7/40* (2013.01); *H01L 21/0274* (2013.01)

(58) Field of Classification Search
CPC .......... G03F 7/038; G03F 7/039; G03F 7/063; G03F 7/168; G03F 7/2004; G03F 7/3057; G03F 7/32; G03F 7/38; G03F 7/40; G03F 7/70858; G03F 7/70866; H01L 21/0274
USPC ..................... 355/27, 77; 430/311
See application file for complete search history.

(56) References Cited

U.S. PATENT DOCUMENTS 5,667,942 A * 9/1997 Nakao ............... G03F 7/168
                                                            430/325
5,968,691 A * 10/1999 Yoshioka ............ G03F 7/16
                                                            430/30

(Continued)

FOREIGN PATENT DOCUMENTS

| KR | 20050071896 | 7/2005 |
| KR | 20070109467 | 11/2007 |

(Continued)

OTHER PUBLICATIONS

Bruce et al ("Effect of Humidity on Photoresist Performance," Journal of the Electrochemical Society, vol. 144, No. 9, Sep. 1997).*

*Primary Examiner* — Colin W Kreutzer

(74) *Attorney, Agent, or Firm* — Haynes and Boone, LLP

(57) ABSTRACT

A photo-sensitive layer is applied over a wafer. The photo-sensitive layer is exposed. In some embodiments, the photo-sensitive layer is exposed to EUV light. The photo-sensitive layer is baked. The photo-sensitive layer is developed. Humidity is introduced in at least one of: the applying, the baking, or the developing.

20 Claims, 12 Drawing Sheets

(51) Int. Cl.
*G03F 7/30* (2006.01)
*G03F 7/06* (2006.01)

(56) References Cited

U.S. PATENT DOCUMENTS

| | | | |
|---|---|---|---|
| 6,002,108 A * | 12/1999 | Yoshioka | G03F 7/38 |
| | | | 219/388 |
| 6,040,120 A * | 3/2000 | Matsushita | G03F 7/38 |
| | | | 257/E21.027 |
| 6,265,323 B1 * | 7/2001 | Nakamura | G03F 7/3021 |
| | | | 438/745 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,841,058 B2 | 9/2014 | Chang | |
| 8,877,409 B2 | 11/2014 | Hsu et al. | |
| 9,012,132 B2 | 4/2015 | Chang | |
| 9,093,530 B2 | 4/2015 | Huang et al. | |
| 9,028,915 B2 | 5/2015 | Chang et al. | |
| 9,146,469 B2 | 9/2015 | Liu et al. | |
| 9,184,054 B1 | 11/2015 | Huang et al. | |
| 9,213,234 B2 | 12/2015 | Chang | |
| 9,223,220 B2 | 12/2015 | Chang | |
| 9,256,123 B2 | 2/2016 | Shih et al. | |
| 9,256,133 B2 | 2/2016 | Chang | |
| 9,529,268 B2 | 12/2016 | Chang et al. | |
| 9,536,759 B2 | 1/2017 | Yang et al. | |
| 9,548,303 B2 | 1/2017 | Lee et al. | |
| 2002/0110760 A1 * | 8/2002 | Lin | G03F 7/168 |
| | | | 430/322 |
| 2003/0077539 A1 | 4/2003 | Lu et al. | |
| 2003/0190427 A1 * | 10/2003 | Gurer | G03F 7/168 |
| | | | 427/335 |
| 2005/0079437 A1 * | 4/2005 | Yamaguchi | G03F 7/0226 |
| | | | 430/141 |
| 2007/0097342 A1 | 5/2007 | Gomei et al. | |
| 2008/0220379 A1 * | 9/2008 | Nomura | G03F 7/38 |
| | | | 430/322 |
| 2009/0305174 A1 * | 12/2009 | Shiobara | G03F 7/168 |
| | | | 430/324 |
| 2017/0205712 A1 * | 7/2017 | Chou | H01L 21/6715 |
| 2018/0164689 A1 * | 6/2018 | Sano | G03F 7/004 |

FOREIGN PATENT DOCUMENTS

| | | |
|---|---|---|
| KR | 20170015197 | 2/2017 |
| KR | 20170026052 | 3/2017 |
| TW | 490736 B | 6/2002 |
| TW | 201202869 A | 1/2012 |
| TW | 201710793 A | 3/2017 |
| TW | 201723669 A | 7/2017 |

* cited by examiner

HUMIDITY CONTROL IN EUV LITHOGRAPHY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

For these advances to be realized, similar developments in IC processing and manufacturing are needed. For example, the need to perform higher resolution lithography processes grows. One lithography technique is extreme ultraviolet (EUV) lithography. The EUV lithography employs scanners using light in the extreme ultraviolet region, having a wavelength of about 1-100 nanometers (nm). Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask.

Despite the increasing popularity of EUV lithography, however, conventional EUV lithography may still have drawbacks. For example, it may be difficult for conventional EUV lithography to simultaneously offer good lithography performance and throughput. Often times, as throughput improves, lithography performance suffers, or vice versa.

Therefore, while conventional EUV lithography has been generally adequate for its intended purposes, it has not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
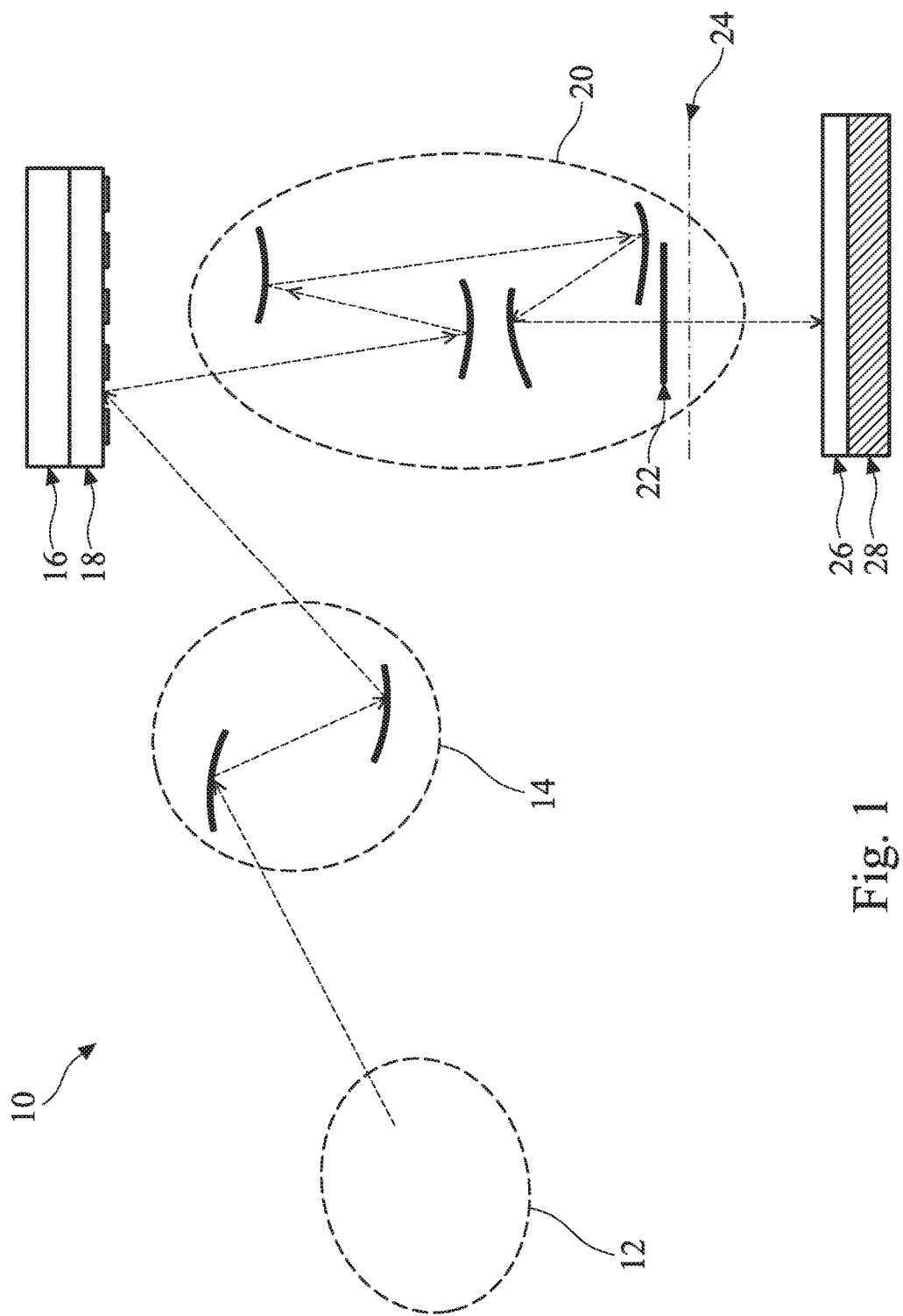
FIG. 1 is a schematic view of a lithography system constructed in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes. However, conventional systems and methods of performing EUV lithography may still have shortcomings. For example, an increase in power/energy (which corresponds to a reduction in resist sensitivity) may result in better lithography performance, such as a smaller linewidth-roughness (LWR). Unfortunately, the increase in power may also lead to a reduced throughput, which increases the cost of semiconductor devices fabricated using EUV lithography. Conventional EUV lithography systems and methods have not been able to offer a solution to this problem.

The inventors of the present disclosure have discovered that EUV photoresist may be sensitive to the presence of water or humidity. For example, the inventors have discovered that, as humidity increases, the EUV photoresist sensitivity may decrease, without necessarily affecting the power or energy of the EUV lithography. This means that an increase in humidity in EUV lithography may simultaneously improve both EUV lithography performance and throughput. As such, the present disclosure intentionally introduces water or humidity to various steps of the EUV lithography, as discussed in more detail below. First, a EUV lithography system will be discussed below with reference to FIGS. 1-2. Next, the details of how the water or humidity is introduced to the various steps of EUV lithography are described according to embodiments of the present disclosure with reference to FIGS. 3-12.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence a being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence c of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate (as an example of the target 26) secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 (such as substrate) is coated with the resist layer sensitive to the radiation beam, such as EUV light in the present embodiment. Various components including those described above are integrated together and are operable to perform lithography exposing processes. The lithography system 10 may further include other modules or may be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
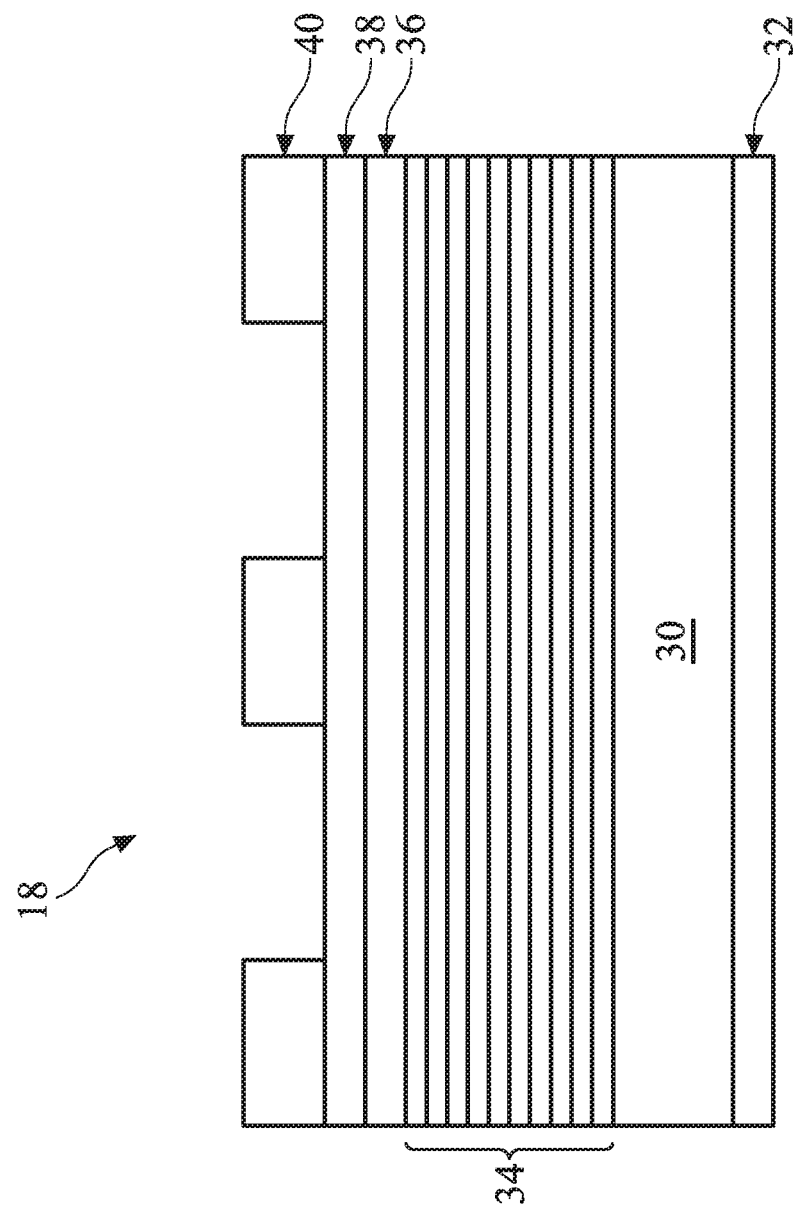
FIG. 2 is a sectional view of an EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer structure 34 disposed over the LTEM substrate 30. The reflective multilayer structure 34 may be selected such that it provides a high reflectivity to a selected radiation type/wavelength. The reflective multilayer structure 34 includes a plurality of film pairs, such as Mo/Si film pairs (e.g., a layer of molybdenum above or below a layer of silicon in each film pair). Alternatively, the reflective multilayer structure 34 may include Mo/Be film pairs, or any materials with refractive index difference being highly reflective at EUV wavelengths.

Still referring to FIG. 2, the EUV mask 18 also includes a capping layer 36 disposed over the reflective multilayer structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3:
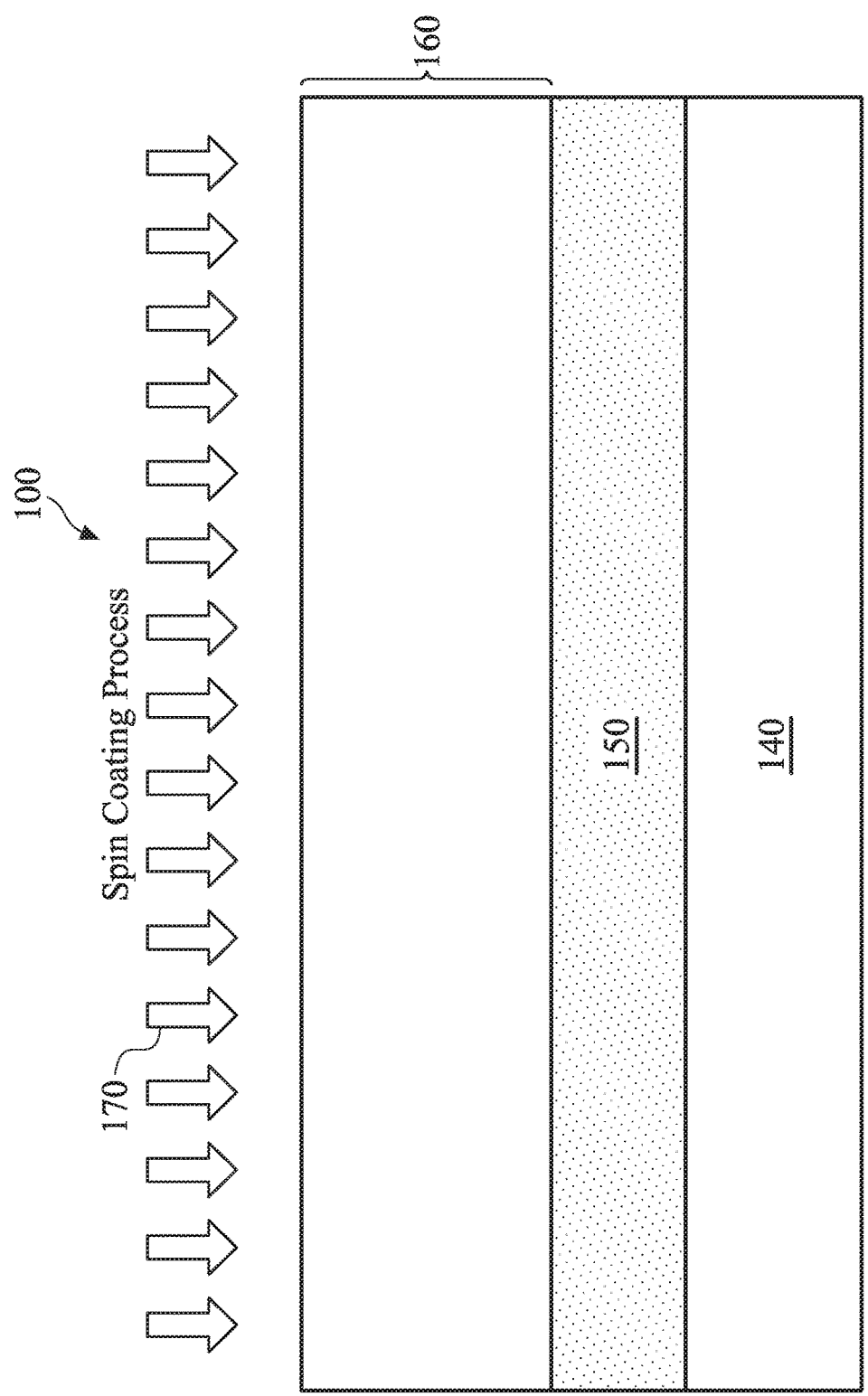
FIGS. 3-9 are diagrammatic fragmentary cross-sectional side views of a semiconductor device at various stages of fabrication in accordance with some embodiments of the present disclosure.

FIGS. 3-9 illustrate simplified diagrammatic fragmentary cross-sectional side views of a semiconductor device 100 at various stages of fabrication according to embodiments of the present disclosure. Referring to FIG. 3, a semiconductor device 100 includes a substrate 140. In some embodiments, the substrate 140 is a silicon substrate doped with a p-type dopant such as boron (for example a p-type substrate). Alternatively, the substrate 140 could be another suitable semiconductor material. For example, the substrate 140 may be a silicon substrate that is doped with an n-type dopant such as phosphorous or arsenic (an n-type substrate). The substrate 140 could include other elementary semiconductors such as germanium and diamond. The substrate 140 could optionally include a compound semiconductor and/or an alloy semiconductor. Further, the substrate 140 could include an epitaxial layer (epi layer), may be strained for performance enhancement, and may include a silicon-on-insulator (SOI) structure.

In some embodiments, the substrate 140 is substantially conductive or semi-conductive. The electrical resistance may be less than about $10^{-3}$ ohm-meter. In some embodiments, the substrate 140 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 140 may contain Ti, Al, Co, Ru, TiN, $WN_2$, or TaN.

In some other embodiments, the substrate 140 contains a dielectric material with a dielectric constant in a range from about 1 to about 140. In some other embodiments, the substrate 140 contains Si, metal oxide, or metal nitride, where the formula is $MX_b$, wherein M is a metal or Si, and X is N or O, and wherein "b" is in a range from about 0.4 to 2.5. For example, the substrate 140 may contain $SiO_2$, silicon nitride, aluminum oxide, hafnium oxide, or lanthanum oxide.

A material layer 150 is formed over the substrate 140. The material layer 150 can be patterned via a lithography process and as such may also be referred to as a patternable layer. In an embodiment, the material layer 150 includes a dielectric material, such as silicon oxide or silicon nitride. In another embodiment, the material layer 150 includes metal. In yet another embodiment, the material layer 150 includes a semiconductor material.

In some embodiments, the material layer 150 has different optical properties than photoresist. For example, the material layer 150 has a different n, k, or T value from photoresist. In some embodiments, the material layer 150 comprises at least one of different polymer structure, acid labile molecule, PAG (photo acid generator) loading, quencher loading, chromophore, cross linker, or solvent, which lead to different n value to photoresist. In some embodiments, the material layer 150 and photoresist have different etching resistance. In some embodiments, the material layer 150 contains an etching resistant molecule. The molecule includes low onishi number structure, double bond, triple bond, silicon, silicon nitride, Ti, TiN, Al, aluminum oxide, SiON, or combinations thereof. It is understood that the substrate 140 and the material layer 150 may each include additional suitable material compositions in other embodiments.

A photoresist layer 160) is formed over the substrate 140 (specifically, over the material layer 150). The photoresist layer 160 may be formed by a spin coating process 170. In the embodiment shown in FIG. 3, the photoresist layer 160 includes a positive photoresist, but it is understood that the photoresist layer 160 may include a negative photoresist in alternative embodiments. The photoresist layer 160 contains chemical components such as a polymer, photo acid generators (PAG), quenchers, chromophore, surfactant, cross linker, etc. In an embodiment, the photo acid generator is bonded to the polymer. In a subsequent photolithography process, photons induce decomposition of the PAG. As a result, a small amount of acid is formed, which further induces a cascade of chemical transformations in the photoresist layer 160. The quencher within the photoresist material helps improve critical dimension (CD) control.

It is understood that the chemical components (such as polymer, PAG, quenchers, chromophore, surfactant, cross linker) discussed above may be a small portion (e.g., between about 1% and 10%, for example about 5%) of the photoresist layer 160. A majority portion of the photoresist layer 160 is a solvent. In some embodiments, the solvent may include Propylene Glycol Monomethyl Ether (PGME), or Propylene Glycol Monomethyl Ether Acetate (PGMEA), or combinations thereof. The solvent may be mixed with the other chemical components (e.g., polymer) of the photoresist layer 160 in a bottle or another suitable container before the photoresist layer 160 is spin-coated or otherwise applied over the layer 150.

For conventional photoresist layers, no water is specifically introduced to the photoresist. In comparison, according to the various aspects of the present disclosure, water (i.e., $H_2O$) is intentionally added to the photoresist layer 160. In some embodiments, water is added to the bottle (or other suitable container) that also contains the chemical components of the photoresist layer 160 discussed above (e.g., polymer, PAG, etc.) as well as the solvent (e.g., PGME or PGMEA). As a result, a mixture is created, where the mixture contains: the various chemical components of the photoresist, the solvent, and water.

In embodiments, a certain amount of water is carefully added to ensure that the water content in the mixture is at a predetermined level. In some embodiments, the predetermined level is between about 1% and about 15%. For example, an appropriate amount of water is added to the mixture such that between about 1%-15% of the mixture is water. In such embodiments, the chemical components of the photoresist layer 160 may still constitute about 1%-10% (e.g., 5%) of the mixture, and the solvent may constitute about 80%-94% of the mixture. In some embodiments, the predetermined level is between about 0.1% and 8% (i.e., about 0.1%-8% of the mixture is water).

It is understood that the predetermined levels of the water content in the mixture are not randomly chosen but specifically configured to ensure the photoresist layer 160 achieves a desired amount of humidity. As discussed above, the photoresist sensitivity is correlated with the humidity level of the photoresist, and a right amount of humidity for the photoresist will reduce the photoresist sensitivity without needing to change the power or energy level of the EUV lithography. Consequently, both EUV lithography performance and throughput may be improved. It is also understood that the mixture containing the chemical components of the photoresist, the solvent, and the water is spin-coated in the process 170 over the material layer 150 to form the photoresist layer 160. In other words, the mixture is effectively turned into the spin-coated photoresist layer 160.

Figure 4:
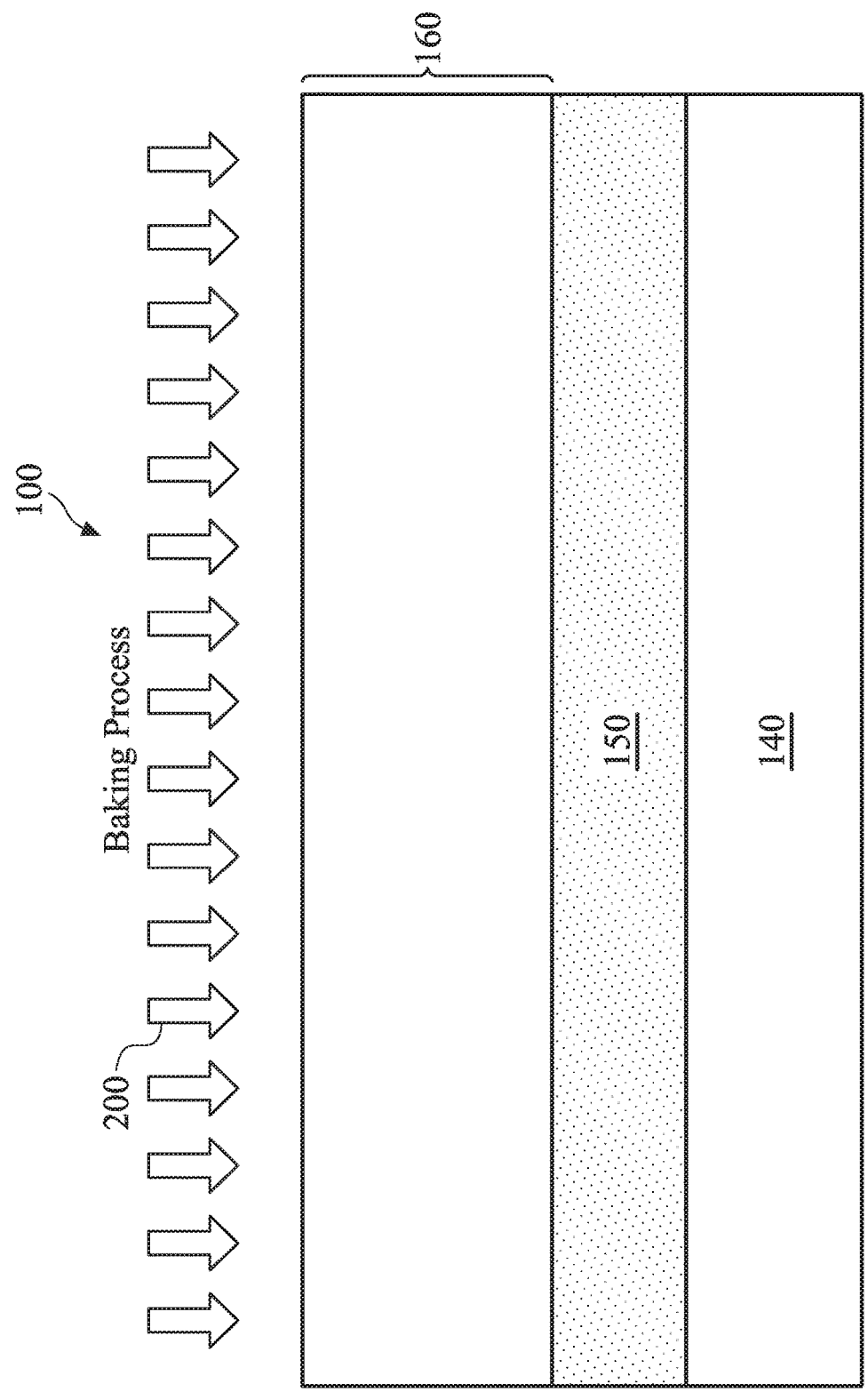

Referring now to FIG. 4, a baking process 200 is performed to the semiconductor device 100 after the spin coating process 170. Since this baking process 200 is performed before exposing the photoresist layer 160, the baking process 200 may also be referred to as a pre-exposure-baking process. The baking process 200 may be performed in a chamber with an adjustable humidity setting, for example in an oven tool of a track system in semiconductor fabrication. In some embodiments, the chamber may include a "hot plate." According to various aspects of the present disclosure, a predetermined level of humidity is intentionally introduced as a part of the baking process 200. In some embodiments, the tool in which the baking process 200 is performed is configured such that the air that the photoresist layer 160 is in contact with has a humidity level that is greater than about 44%, for example at a humidity level between about 46%-55%. This specifically-configured humidity level allows the photoresist layer 160 to have decreased sensitivity without changing the power or energy of the lithography process (e.g., the exposure process to be performed subsequently), and this improves both lithography performance and throughput.

Figure 5:
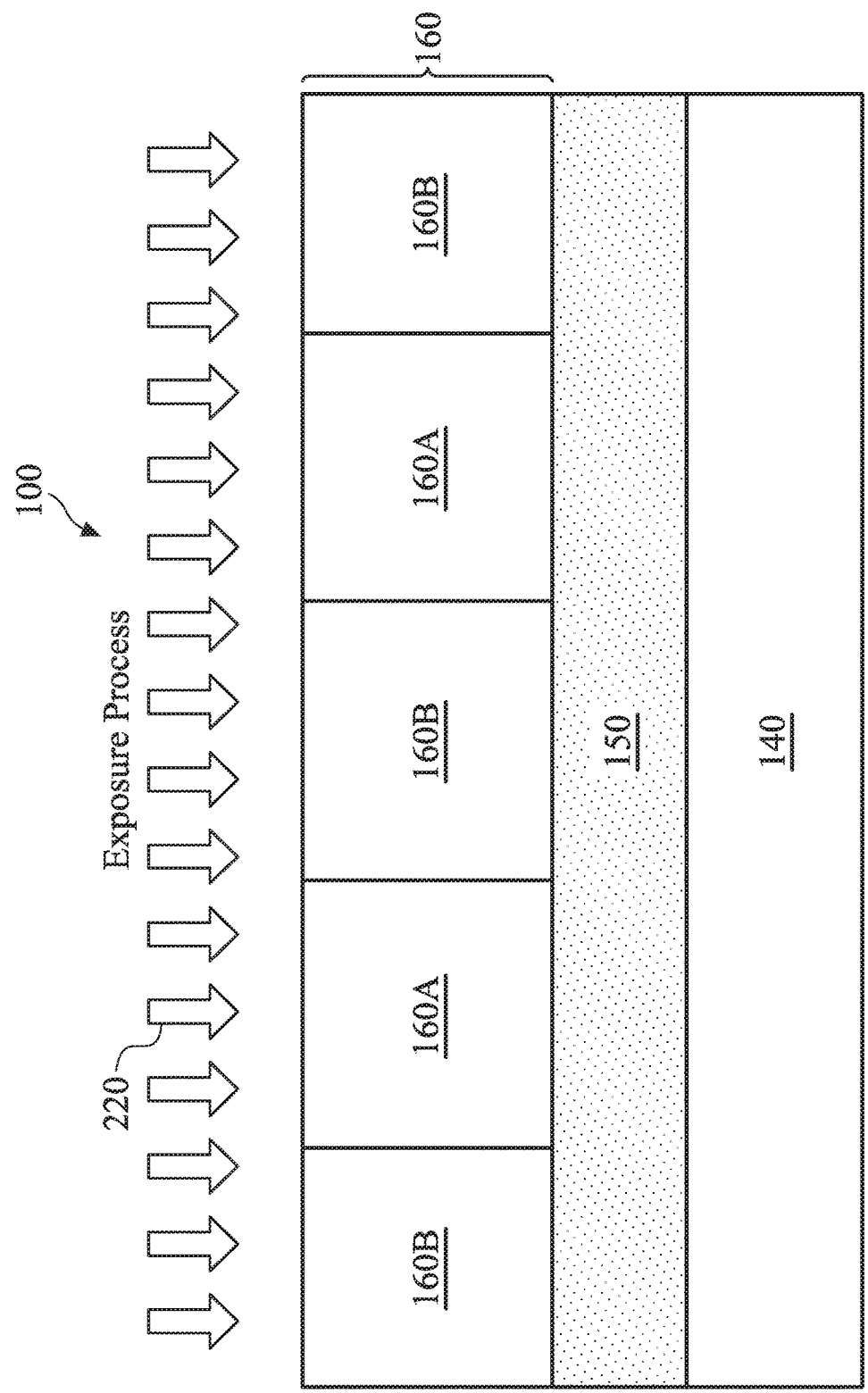

Referring now to FIG. 5, an exposure process 220 is performed to the semiconductor device 100 after the baking process 200. In the illustrated embodiment, the exposure 220 includes an EUV exposure. As a part of the exposure, a light source (or illumination source) is used that has a wavelength less than about 250 nm, for example about 13.5 nm in some embodiments. In some embodiments, the illumination source has at least one of: KrF, ArF, EUV, or E-beam. The light source exposes one or more predetermined regions 160A of the photoresist layer 160, while other regions 160B of the photoresist layer 160 are prevented from exposure through the use of a patterned lithography photomask. For example, the patterned lithography photomask may be an embodiment of the EUV mask 18 discussed above with reference to FIGS. 1-2.

Figure 6:
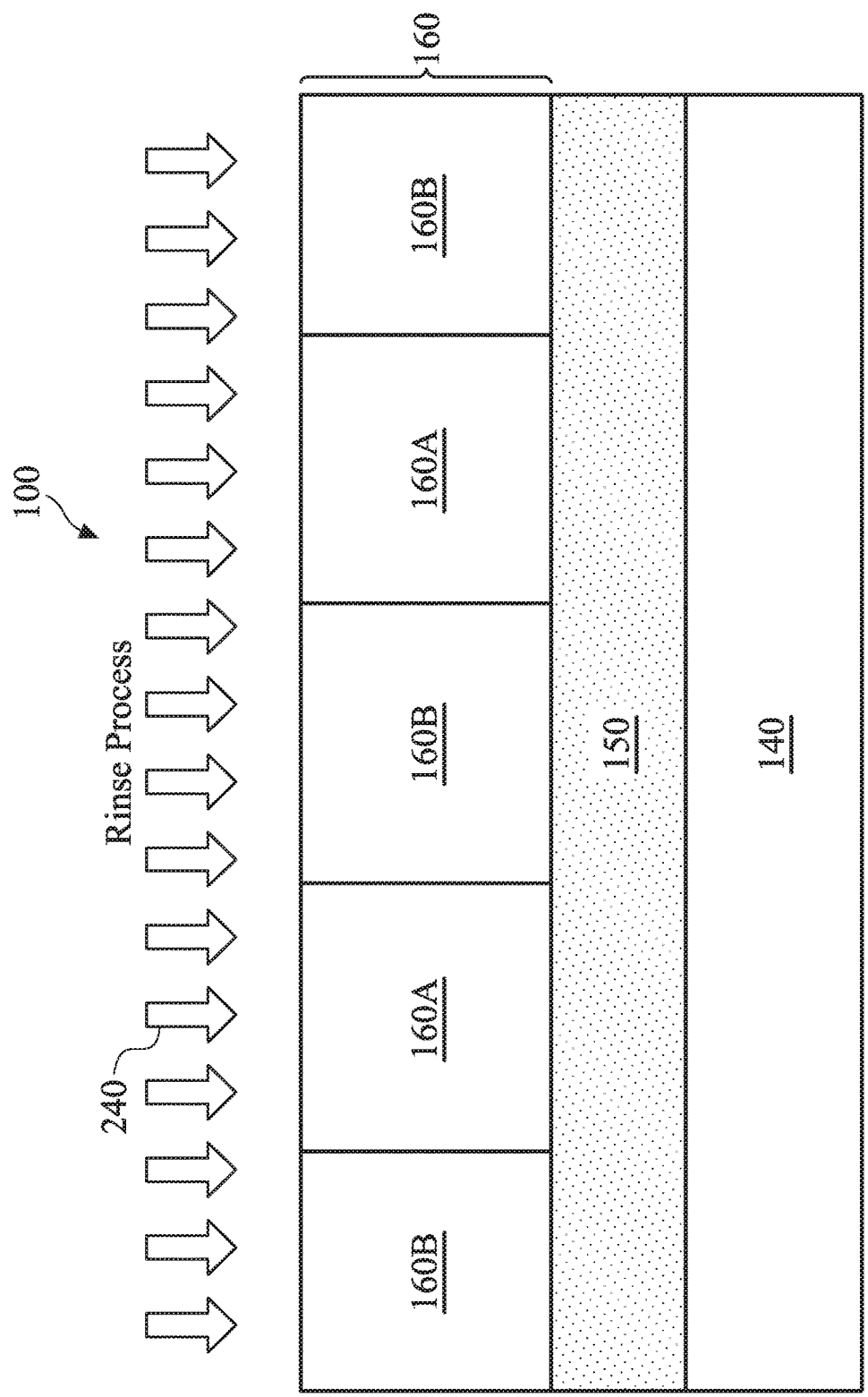

Referring now to FIG. 6, a rinse process 240 is performed to the semiconductor device 100 after the exposure process 220. The rinse process 240 is configured to introduce water or humidity to the photoresist layer 160. In some embodiments, the rinse process 240 includes rinsing the photoresist layer 160 with a liquid solution that includes a solvent and water. In some embodiments, the solvent includes Propylene glycol methyl ether acetate, Propylene glycol methyl ether. Butyl acetate, 1-Ethoxy-2-propanol, gamma-Butyrolactone, Cyclohexanone, Ethyl lactate, Methanol, Ethanol, Propanol, n-Butanol, Acetone, Dimethylformamide, Acetonitrile, Isopropyl alcohol, Tetrahydrofuran, Acetic acid, or combinations thereof. The amount of water added to the liquid solution is also carefully configured. In some embodiments, the water constitutes between about 0.1% and about 10% of the liquid solution, for example about 0.1% and about 5% of the liquid solution. It is understood that in some embodiments, a water vapor treatment process may be performed instead of, or in combination with, the rinse process 240, where the water vapor treatment process applies a water vapor to the photoresist layer 160. It is also understood that the performance of the rinse process 240 is optional in some embodiments.

Figure 7:
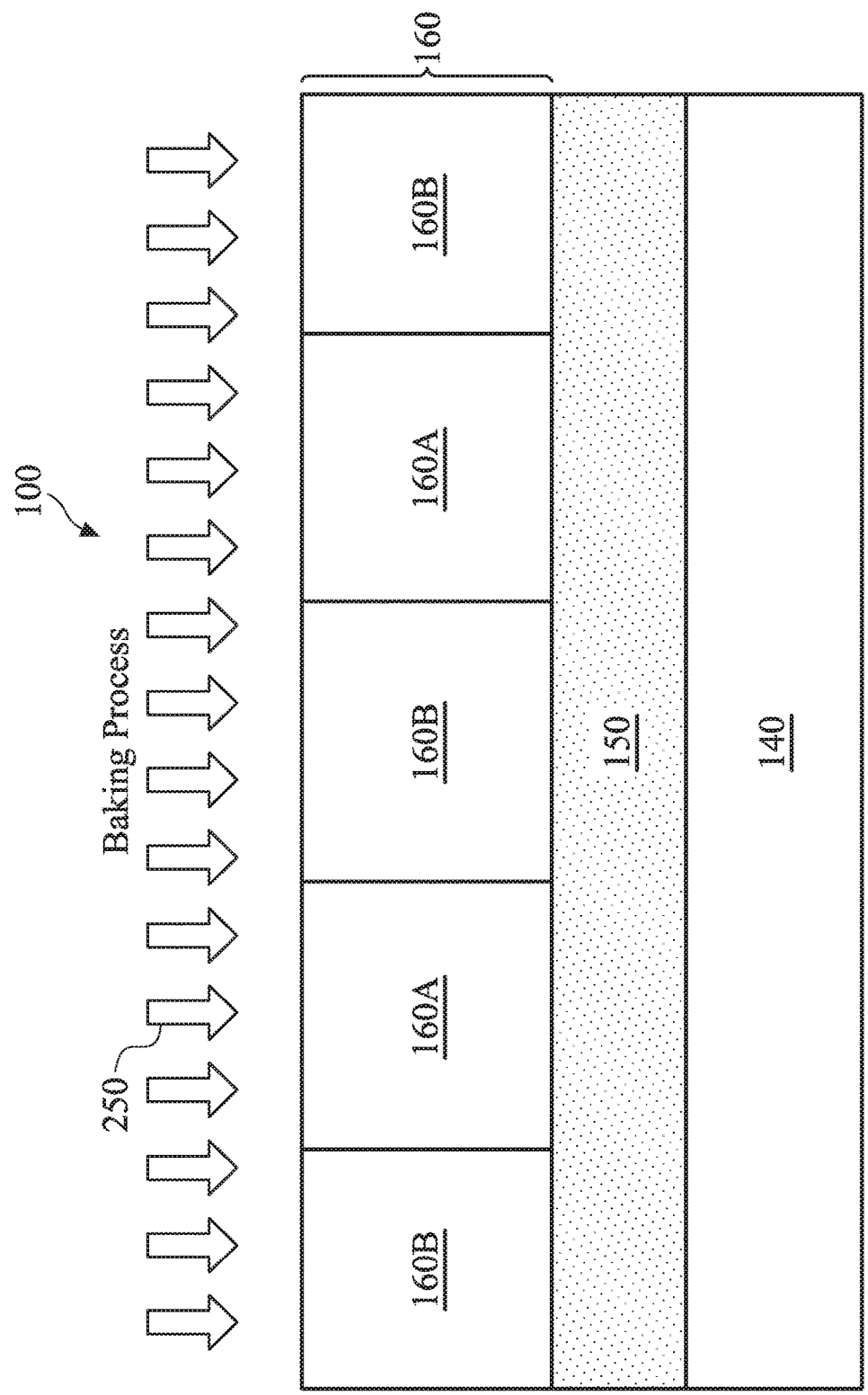

Referring now to FIG. 7, a baking process 250 is performed to the semiconductor device 100 after the rinse process 240 (or after the exposure process 220 if the rinse process 240 is skipped). Since this baking process 250 is performed after the exposure process 220 that exposes the photoresist layer 160, the baking process 250 may also be referred to as a post-exposure-baking (PEB) process. The baking process 250 may also be performed in a chamber (e.g., a hot plate) with an adjustable humidity setting, for example in an oven tool of a track system in semiconductor fabrication.

In some embodiments, the baking process 250 and the baking process 200 are performed in the same hot plate or using the same tool. Also similar to the baking process 200, the baking process 250 intentionally introduces a predetermined level of humidity to the photoresist layer 160. For example, the hot plate (or any other suitable tool in which the baking process 250 is performed) is specifically configured to achieve a humidity level between about 46%-55% for the air exposed to the photoresist layer 160. As was the case for the baking process 200, this specifically-configured humidity level associated with the baking process 250 also allows the photoresist layer 160 to have decreased sensitivity without changing the power or energy level of the lithography process, which helps improve both lithography performance and throughput. It is understood that the particular humidity levels for the baking process 250 and for the baking process 200 may be configured to be the same in some embodiments, or differently in other embodiments.

Figure 8:
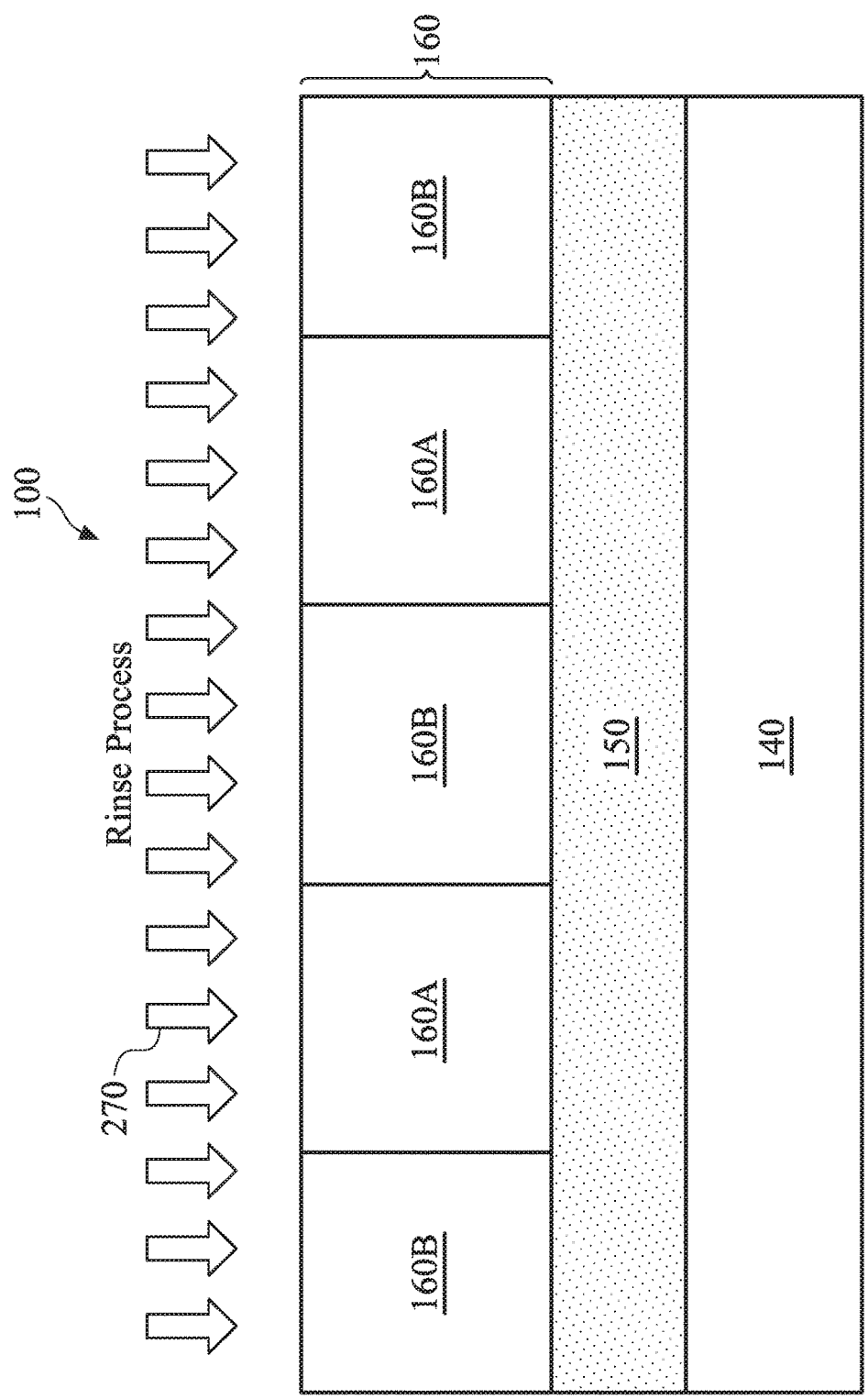

Referring now to FIG. 8, a rinse process 270 is performed to the semiconductor device 100 after the baking process 250. Similar to the rinse process 240, the rinse process 270 is configured to introduce water or humidity to the photoresist layer 160. In some embodiments, the rinse process 240 includes rinsing the photoresist layer 160 with a liquid solution that includes a solvent and water. In some embodiments, the solvent includes Propylene glycol methyl ether acetate, Propylene glycol methyl ether, Butyl acetate, 1-Ethoxy-2-propanol, gamma-Butyrolactone, Cyclohexanone, Ethyl lactate, Methanol, Ethanol, Propanol, n-Butanol, Acetone, Dimethylformamide, Acetonitrile, Isopropyl alcohol, Tetrahydrofuran, Acetic acid, or combinations thereof. The amount of water added to the liquid solution is also carefully configured. In some embodiments, the water constitutes between about 0.1% and about 10% of the liquid solution, for example about 0.1% and about 5% of the liquid solution. It is understood that a water vapor treatment process may be performed instead of, or in combination with, the rinse process 270, and that the performance of the rinse process 270 is optional in some embodiments.

Figure 9:
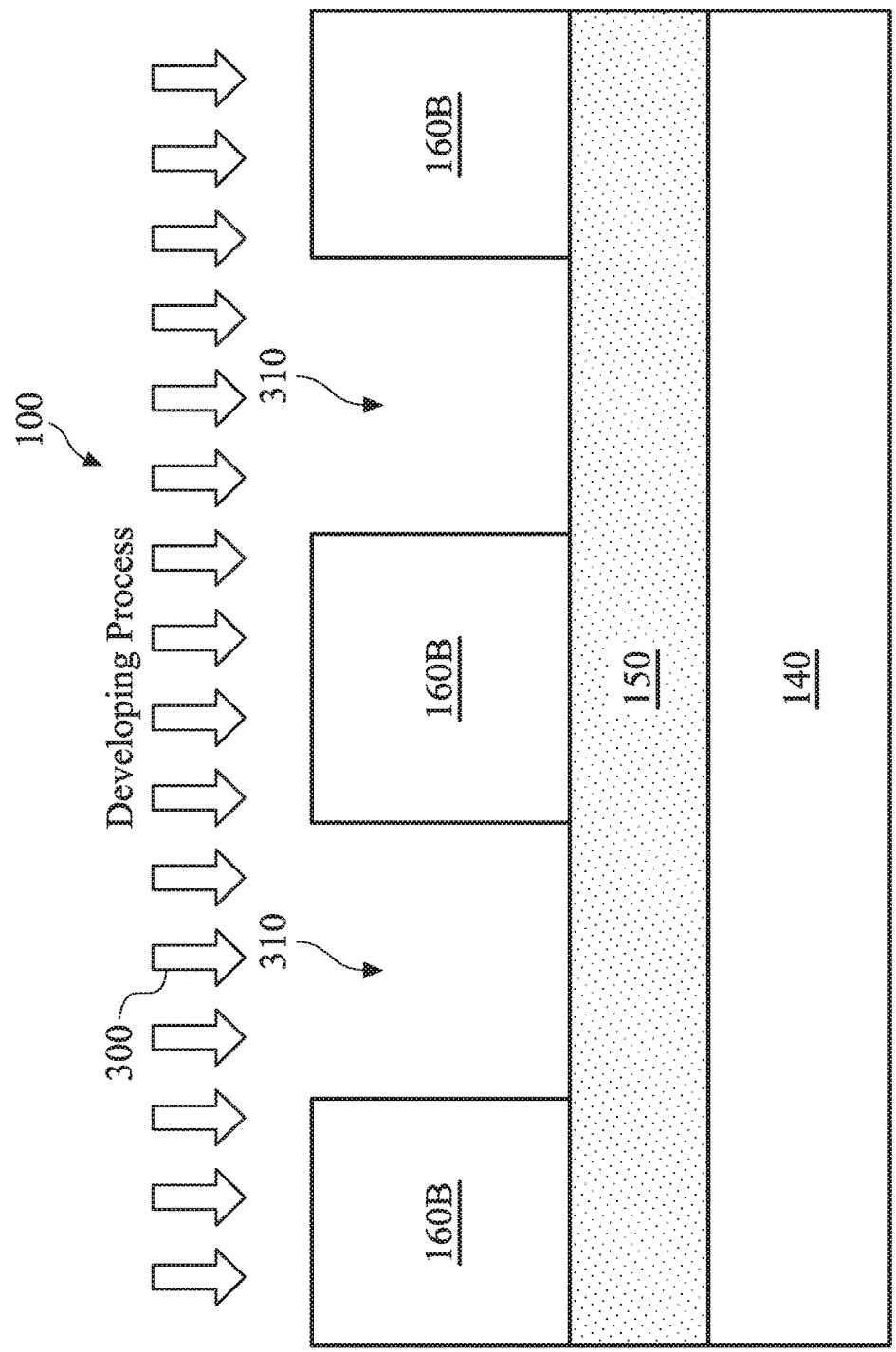

Referring now to FIG. 9, a developing process 300 is performed to the photoresist layer 160 after the rinse process 270 (or after the baking process 250 if the rinse process 270 is skipped). The developing process 300 includes applying a developer solution to the photoresist layer 160, where the developer solution includes a solvent developer and water. In some embodiments, the solvent developer includes 2-heptanone, n-Butyl acetate (NBA), isoamyl acetate, or combinations thereof.

Once again, water is added to the developer solution herein to introduce humidity to the photoresist layer 160, and the amount of water added to the developer solution is also carefully configured. In some embodiments, the water constitutes between about 0.1% and about 10% of the developer solution, for example about 0.1% and about 5% of the developer solution.

As is shown in FIG. 9, the performance of the developing process 300 patterns the photoresist layer 160. Assuming a positive-tone photoresist is used, the exposed portions 160A of the photoresist layer 160 are removed after the developing process 300, as the exposure to the EUV light changes the chemical structure of the photoresist and makes it more soluble in the developer solution. Meanwhile, the unexposed portions 160B of the photoresist layer 160 remain, thereby forming openings 310 in place of the removed portions 160A. On the other hand, if the photoresist layer 160 had been a negative-tone photoresist, then the exposed portions 160A would have remained after the developing process 300, while the unexposed portions 160B would have been removed. In any case, the pattern photoresist layer 160 can now be used to pattern the material layer 150 therebelow in subsequent fabrication processes.

Figure 10:
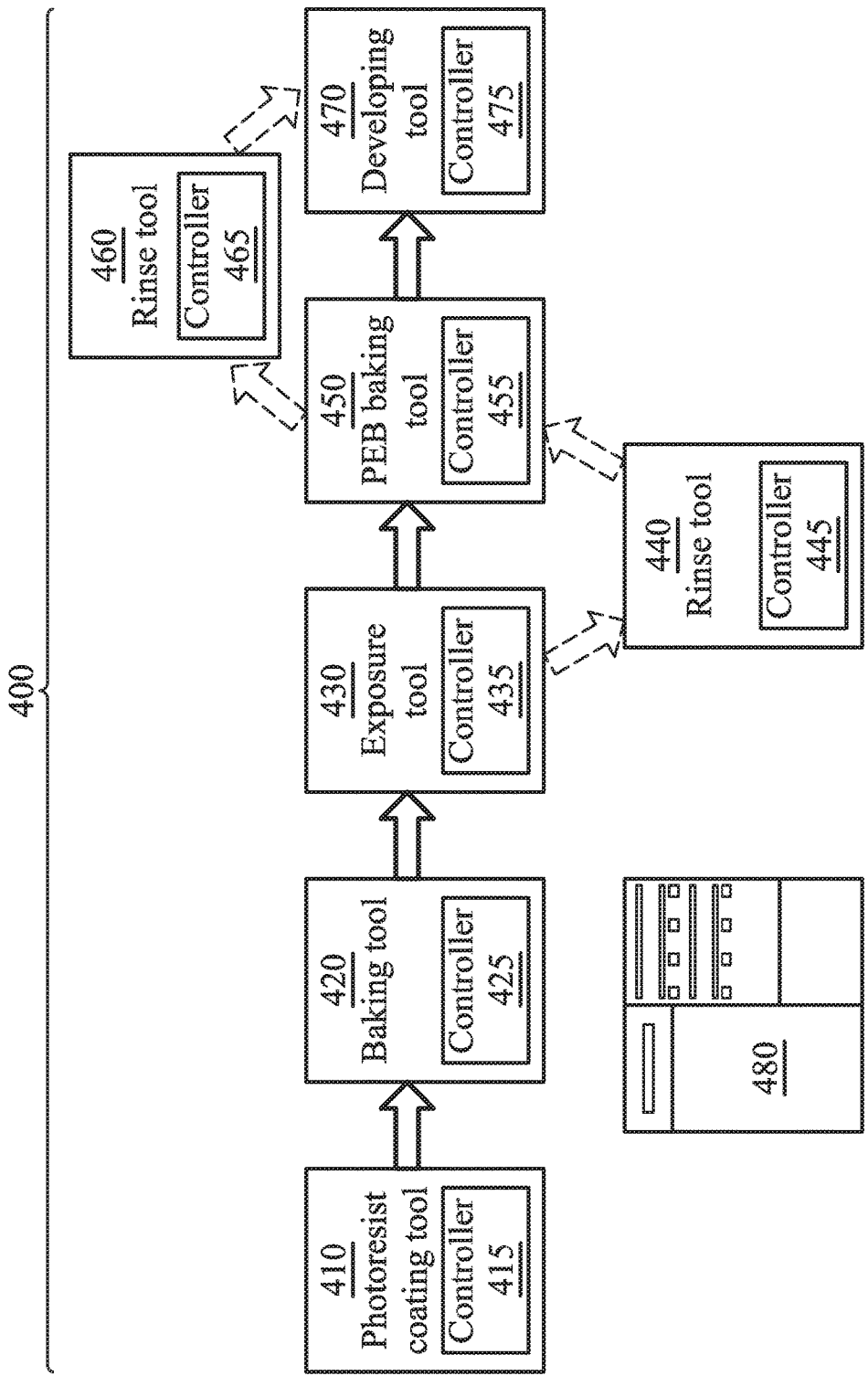
FIG. 10 is a diagrammatic view of a system for fabrication a semiconductor device in accordance with some embodiments of the present disclosure.

FIG. 10 is a simplified diagrammatic view of a portion of a semiconductor fabrication system 400 that may be used to perform the various fabrication processes discussed above with reference to FIGS. 3-9. The fabrication system 400 includes a photoresist coating tool 410. The photoresist coating tool 410 may be used to coat the photoresist layer 160 over the layer 150 as a part of the spin coating process 170 discussed above with reference to FIG. 3. In some embodiments, the photoresist coating tool 410 includes a bottle or container for mixing the photoresist chemicals (e.g., polymer, PAG, etc.), the solvent, and the water. The photoresist coating tool 410 may also include nozzles for spraying liquids, such as the mixture that is made up of the photoresist chemicals, the solvent, and the water. The photoresist coating tool 410 may also include a stage for holding and/or spinning a wafer while the photoresist layer 160 is coated thereon. The photoresist coating tool 410 may further include a controller 415 for configuring the various process parameters of the spin coating process 170, for example the amount of water to add to the mixture (e.g., to achieve a water content between about 1% and about 15% of the mixture).

The fabrication system 400 includes a baking tool 420. The baking tool 420 may be used to bake the photoresist layer 160 as a part of the baking process 200 discussed above with reference to FIG. 4. In some embodiments, the baking tool 420 includes a "hot plate" as a part of a track semiconductor fabrication system. The hot plate may have an adjustable setting for humidity control. The baking tool 420 may also include a controller 425 for configuring the various process parameters of the baking process 200, for example the humidity setting of the hot plate. In some embodiments, the controller 425 may configure the humidity of the baking tool to exceed about 44%, for example in a range between about 46% and about 55%.

The fabrication system 400 includes an exposure tool 430. The exposure tool 430 may be used to expose the photoresist layer 160 as a part of the exposure process 220 discussed above with reference to FIG. 5. In some embodiments, the exposure tool 430 includes an EUV scanner, such as the EUV lithography system 10 discussed above with reference to FIG. 1. The exposure tool 430 may also include a controller 435 for configuring the various process parameters of the exposure process 220.

The fabrication system 400 includes a rinse tool 440. The rinse tool 440 may be used to rinse the photoresist layer 160 as a part of the rinse process 240 discussed above with reference to FIG. 6. In some embodiments, the rinse tool 440 includes nozzles or other dispensing units that are configured to dispense the solvent with water mixed therein. The rinse tool 440 may also include a controller 445 for configuring the various process parameters of the rinse process 240, for example the amount of water to add to the solvent. In some embodiments, the controller 445 may configure the water content in the dispensed rinsing liquid solution to be in a range between about 0.1% and about 10%.

The fabrication system 400 includes a post-exposure baking (PEB) tool 450. The PEB tool 420 may be used to bake the photoresist layer 160 as a part of the baking process 250 discussed above with reference to FIG. 7. In some embodiments, the baking tool 450 includes a "hot plate" as a part of a track semiconductor fabrication system. The hot plate may have an adjustable setting for humidity control. The baking tool 450 may also include a controller 455 for configuring the various process parameters of the baking process 250, for example the humidity setting of the hot plate. In some embodiments, the controller 455 may configure the humidity of the baking tool to exceed about 44%, for example in a range between about 46% and about 55%. In some embodiments, a purge gas that contains $N_2$ and $CO_2$ may be mixed into the hot plate (or any other storage place) of the PEB baking tool 450, in order to improve reaction control. A ratio of the $N_2/CO_2$ within the purge gas is between about 54% to about 100%, so as to optimize sensitivity control. In some embodiments, the purge gas that contains $N_2/CO_2$ may also be optionally used for the baking tool 420.

The fabrication system 400 includes a rinse tool 460. The rinse tool 460 may be used to rinse the photoresist layer 160 as a part of the rinse process 270 discussed above with reference to FIG. 8. In some embodiments, the rinse tool 460 includes nozzles or other dispensing units that are configured to dispense the solvent with water mixed therein. The rinse tool 460 may also include a controller 465 for configuring the various process parameters of the rinse process 270, for example the amount of water to add to the solvent. In some embodiments, the controller 465 may configure the water content in the dispensed rinsing liquid solution to be in a range between about 0.1% and about 10%.

The fabrication system 400 includes a developing tool 470. The developing tool 470 may be used to develop the photoresist layer 160 as a part of the developing process 300 discussed above with reference to FIG. 9. In some embodiments, the developing tool 470 includes nozzles or other dispensing units that are configured to dispense the developer solution with water mixed therein. The developing tool 470 may also include a controller 475 for configuring the various process parameters of the developing process 240, for example the amount of water to add to the developer solution. In some embodiments, the controller 475 may configure the water content in the dispensed developer solution to be in a range between about 0.1% and about 10%.

It is understood that the arrows shown in FIG. 10 indicate the sequential order in which the semiconductor fabrication processes are performed using the system 400. The dashed arrows before and after the rinse tool 440 and the rinse tool 460 indicate that the rinse processes using the rinse tools 440 and 460 are optionally performed. In other words, in some embodiments, the rinse process 240 associated with the rinse tool 440 is performed after the exposure process 220 using the exposure tool and before the baking process 250 using the baking tool 450, but the rinse process 270 associated with the rinse tool 460 is not performed. In other embodiments, the rinse process 240 associated with the rinse tool 440 is not performed, but the rinse process 270 associated with the rinse tool 460 is performed after the baking process 250 using the baking tool 450 and before the developing process 300 using the developing tool 470.

Although the tools 410-470 of the system 400 are illustrated as separate tools in FIG. 10, it is understood that one or more of these tools may be integrated into the same tool. For example, the PEB tool 450 and the baking tool 420 may be implemented as the same tool. In other words, the same "hot plate" may be used as both the baking tool 420 to perform the baking process 200 and as the PEB tool 450 to perform the baking process 250. Similarly, the rinse tool 440 and the rinse tool 460 may be implemented as the same tool to perform both the rinse process 240 and the rinse process 270. In addition, some of the tools 410-470 discussed above may share certain components, such as the nozzles or dispensing units for dispensing liquids, or even the controllers 415-475. In addition, the system 400 may also include a standalone (i.e., physically outside of the tools 410-470) controller 480 in some embodiments, where the controller 480 may be used to duplicate or replace one or more of the functionalities of any of the controllers 415-475.

Figure 11:
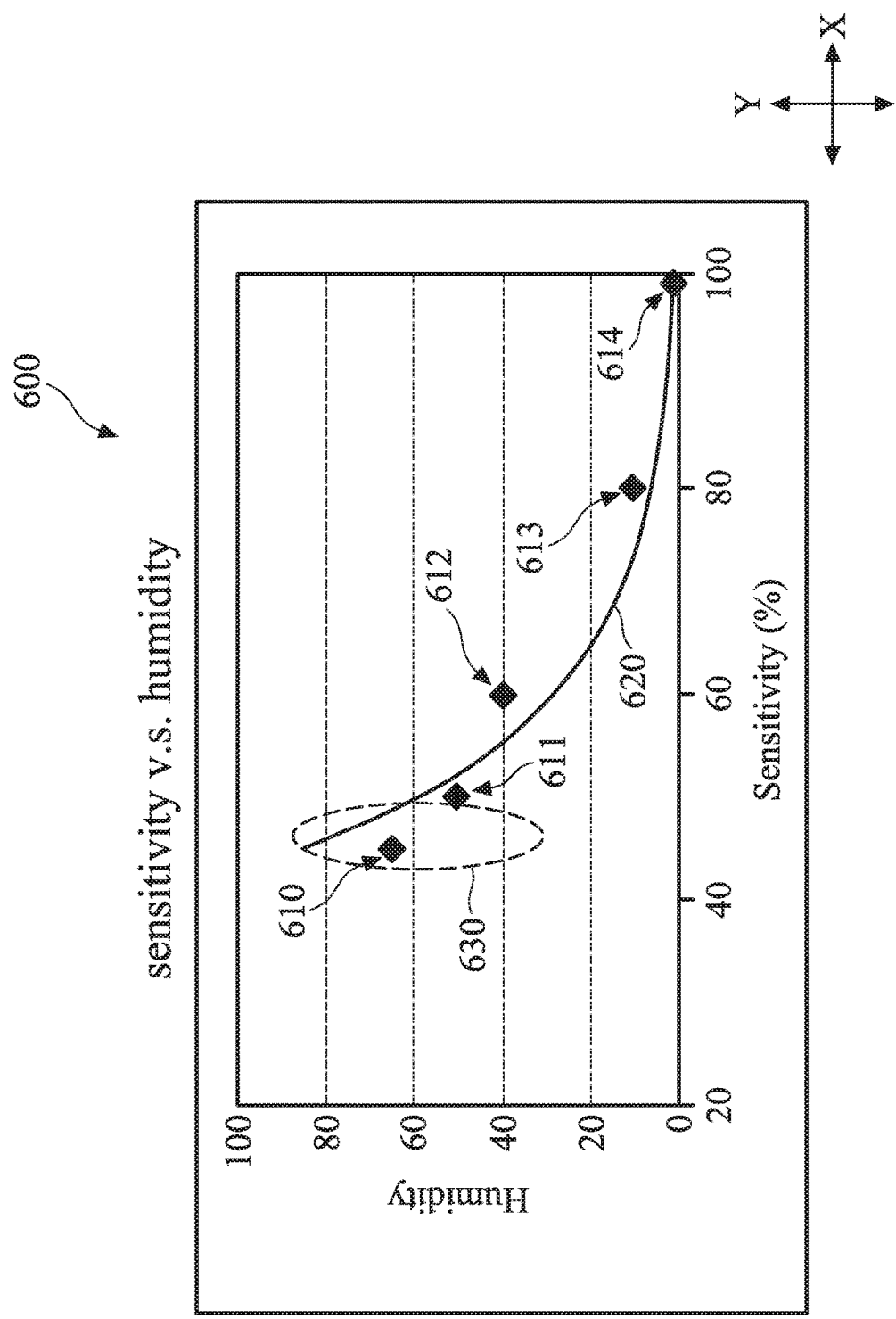
FIG. 11 is a graph illustrating a relationship between humidity and sensitivity for the photoresist in accordance with some embodiments of the present disclosure.

FIG. 11 is a graph 600 illustrating a relationship between sensitivity and the humidity for the photoresist of the present disclosure. In more detail, the X-axis of the graph 600 represents the sensitivity of the photoresist (measured as a percentage), and the Y-axis of the graph 600 represents the humidity of the photoresist (also measured as a percentage). The graph 600 includes a plurality of data samples such as data samples 610-614, where each data sample corresponds to a certain humidity and a certain sensitivity. A plot 620 is generated for the graph 600 based on the data samples 610-614.

As the plot 620 shows, the sensitivity is reduced as the humidity increases (at least up to a certain point). As such, it may be desirable to increase the humidity of the photoresist according to the various steps of the present disclosure discussed above, in order to reduce the photoresist sensitivity. Of course, the photoresist should not be too diluted by water in actual fabrication. In order to achieve optimal results without diluting the photoresist too much, the various processes of the present disclosure are configured such that the humidity in EUV lithography is controlled within a zone 630.

Figure 12:
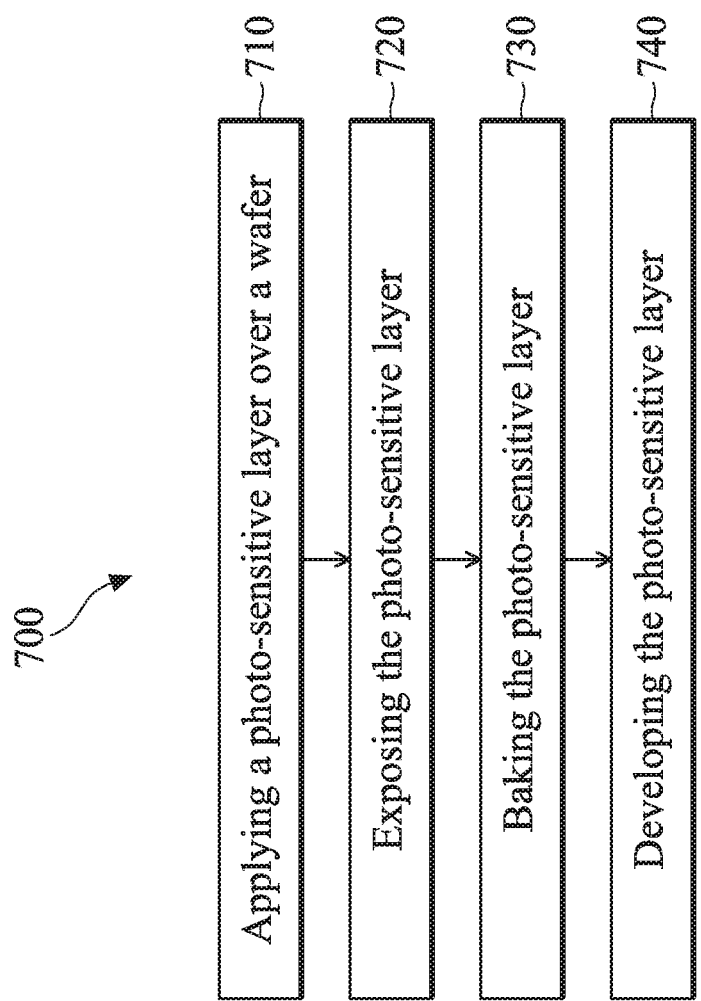
FIG. 12 is a flowchart of a method of fabricating a semiconductor device in accordance with some embodiments of the present disclosure.

FIG. 12 is a flowchart illustrating a simplified method 700. The method 700 includes a step 710 of applying a photo-sensitive layer over a wafer.

The method 700 includes a step 720 of exposing the photo-sensitive layer. In some embodiments, the exposing comprises exposing the photo-sensitive layer to an extreme ultraviolet (EUV) light.

The method 700 includes a step 730 of baking the photo-sensitive layer.

The method 700 includes a step 740 of developing the photo-sensitive layer.

As a part of the method 700, humidity is introduced in at least one of: the step 710 of applying the photo-sensitive layer, the step 720 of baking the photo-sensitive layer, or the step 740 of developing the photo-sensitive layer. In some embodiments, the introducing of the humidity is performed before or during the step 710 of applying the photo-sensitive layer. In some embodiments, the introducing of the humidity is performed such that between about 1% and about 15% of the photo-sensitive layer is water.

In some embodiments, the introducing of the humidity is performed during the baking step 730. In some embodiments, the baking is performed with a humidity setting of between about 46% and about 55%. In some embodiments, the baking is performed before the exposing step 720 and after the exposing step 720.

In some embodiments, the introducing of the humidity is performed during the developing step 740. In some embodiments, a water content in a developer solution used in the developing is in a range between about 0.1% and about 10%.

It is understood that additional fabrication processes may be performed before, during, or after the steps 710-740 of FIG. 12. For example, the method 700 may include a step of rinsing the photo-sensitive layer after the exposing step 720 but before the baking step 730. In some embodiments, the rinsing is performed with a liquid, wherein the water content in the liquid is in a range between about 0.1% and about 10%. As another example, the method 700 may include a step of rinsing the photo-sensitive layer after the baking step 730 but before the developing step 740. In some embodiments, the rinsing is performed with a liquid, wherein a water content in the liquid is in a range between about 0.1% and about 10%. Other processes are not discussed in detail herein for reasons of simplicity.

Based on the above discussions, it can be seen that the present disclosure offers various advantages in EUV lithography. It is understood, however, that not all advantages are necessarily discussed herein, and other embodiments may offer different advantages, and that no particular advantage is required for all embodiments. One of the advantages is that by increasing the humidity of the EUV photoresist, the sensitivity of the photoresist is reduced. As a result, the EUV lithography performance can be improved without needing to increase the power or energy of the exposure process. Meanwhile, wafer throughput can also be improved. In other words, the present disclosure may simultaneously improve both throughput and lithography performance via the carefully configured introduction of water or humidity in the lithography processes. Another advantage is that the processes discussed above are compatible with existing fabrication process flow and are easy to implement.

The present disclosure provides for a method. The method includes: applying a photo-sensitive layer over a wafer; exposing the photo-sensitive layer; baking the photo-sensitive layer; developing the photo-sensitive layer; and introducing humidity in at least one of: the applying, the baking, or the developing.

The present disclosure further provides a material. The material includes: a photo-sensitive material for an extreme ultraviolet (EUV) lithography; a solvent; and water.

The present disclosure further provides a semiconductor fabrication system. The semiconductor fabrication system includes: a first component configured to apply a photoresist layer over a wafer; a second component configured to bake the photoresist layer; a third component configured to expose the photoresist layer; and a fourth component configured to develop the photoresist layer; wherein at least one of the first component, the second component, and the fourth component is further configured to introduce humidity or water to the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a photo-sensitive layer over a wafer;
exposing the photo-sensitive layer;
baking the photo-sensitive layer;
developing the photo-sensitive layer;
rinsing the photo-sensitive layer after the exposing but before the baking, or after the baking but before the developing, wherein the rinsing is performed with a liquid, wherein a water content in the liquid is in a range between about 0.1% and about 10%; and
introducing humidity in at least one of: the applying, the baking, or the developing.

2. The method of claim 1, wherein the introducing is performed at least before or during the applying of the photo-sensitive layer.

3. The method of claim 2, wherein the introducing is performed such that between about 1% and about 15% of the photo-sensitive layer is water.

4. The method of claim 1, wherein the exposing comprises exposing the photo-sensitive layer to an extreme ultraviolet (EUV) light.

5. The method of claim 1, wherein the introducing is performed at least during the baking.

6. The method of claim 5, wherein the baking is performed before the exposing and after the exposing and with a humidity setting of between about 46% and about 55%.

7. The method of claim 1, further comprising: adding a purge gas that contains $N_2$ and $CO_2$ during the baking that is performed after the exposing.

8. The method of claim 1, wherein the introducing is performed at least during the developing, and wherein a water content in a developer solution used in the developing is in a range between about 0.1% and about 10%.

9. A semiconductor fabrication system, comprising:
a first component configured to apply a photoresist layer over a wafer;
a second component configured to bake the photoresist layer;
a third component configured to expose the photoresist layer;
a fourth component configured to develop the photoresist layer; and
a fifth component configured to rinse the photoresist layer with a liquid that includes water, wherein a water content in the liquid is in a range between about 0.1% and about 10%;
wherein at least one of the first component, the second component, and the fourth component is further configured to introduce humidity or water to the photoresist layer.

10. The semiconductor fabrication system of claim 9, wherein the third component is configured to expose the photoresist layer using extreme ultraviolet (EUV) light.

11. The semiconductor fabrication system of claim 9, further comprising a controller configured to set a humidity level or an amount of water that is introduced to the photoresist layer.

12. A semiconductor fabrication system, comprising:
a photoresist coating tool configured to coat a photoresist material over a wafer;
an exposure tool configured to expose the coated photoresist material using extreme ultraviolet (EUV) light;
a baking tool configured to bake the photoresist material, wherein the baking tool is configured to introduce humidity or water to the photoresist material, and wherein the baking tool includes a hot plate having an adjustable humidity setting, and wherein the baking tool is further configured to mix a purge gas containing $N_2$ and $CO_2$ into the hot plate;

a rinsing tool configured to rinse the photoresist material; and a developing tool configured to develop the photoresist material.

13. The semiconductor fabrication system of claim 12, wherein the baking tool further includes:

a controller configured to control the humidity setting of the hot plate.

14. The semiconductor fabrication system of claim 13, wherein the controller is configured to set the humidity setting in a range between about 46% and about 55%.

15. The semiconductor fabrication system of claim 13, wherein a ratio of the $N_2/CO_2$ is between about 54% and about 100%.

16. The semiconductor fabrication system of claim 9, wherein the second component is configured to introduce a purge gas containing $N_2$ and $CO_2$.

17. The semiconductor fabrication system of claim 16, wherein a ratio of the $N_2/CO_2$ is between about 54% and about 100%.

18. The semiconductor fabrication system of claim 16, wherein the second component includes a heated plate having an adjustable humidity setting, and wherein the purge gas is introduced to the heated plate.

19. The semiconductor fabrication system of claim 12, wherein the photoresist resist coating tool, the rinsing tool, or the developing tool is further configured to increase a water content within the photoresist material.

20. The semiconductor fabrication system of claim 13, wherein the rinsing tool is configured to rinse the photoresist material with a liquid, and wherein a water content in the liquid is in a range between about 0.1% and about 10%.

* * * * *